United States Patent (10) Patent No.: US 12,405,318 B2
Mashaly et al. (45) Date of Patent: Sep. 2, 2025

(54) METHOD AND APPARATUS FOR FAST SHORT CIRCUIT DETECTION OF A SHORT CIRCUIT AT A GATE-CONTROLLED POWER SWITCH

(71) Applicant: ROHM CO., LTD., Kyoto (JP)

(72) Inventors: Aly Mashaly, Kyoto (JP); Ignacio Lizama, Kyoto (JP); Vikneswaran Thayumanasamy, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 160 days.

(21) Appl. No.: 18/476,574

(22) Filed: Sep. 28, 2023

(65) Prior Publication Data

US 2024/0019501 A1 Jan. 18, 2024

Related U.S. Application Data

(63) Continuation of application No. PCT/IB2021/052690, filed on Mar. 31, 2021.

(51) Int. Cl.
*G01R 31/52* (2020.01)
*G01R 15/04* (2006.01)
*G01R 19/00* (2006.01)
*H03K 17/082* (2006.01)

(52) U.S. Cl.
CPC ........... *G01R 31/52* (2020.01); *G01R 15/04* (2013.01); *G01R 19/0038* (2013.01); *H03K 17/0822* (2013.01)

(58) Field of Classification Search
CPC .... G01R 15/04; G01R 19/0038; G01R 31/52; H03K 17/0822

USPC .......................................................... 361/86
See application file for complete search history.

(56) References Cited

U.S. PATENT DOCUMENTS

2012/0153719 A1 * 6/2012 Inaba ...................... B60L 3/003
327/109
2013/0083576 A1 * 4/2013 Gan ...................... H03K 17/168
327/482

FOREIGN PATENT DOCUMENTS

JP 2020102973 A * 7/2020
WO WO-2018203422 A1 * 11/2018 .............. H02M 1/08

OTHER PUBLICATIONS

Machine translation of Ishikawa et al. Japanese Patent Document JP 2020-102973 A Jul. 2020 (Year: 2020).*
Iwabuki et al. International Patent Document WO 2018203422 A Nov. 2018 (Year: 2018).*
Sun et al. "Design, Analysis, and Discussion of Short Circuit and Overload Gate-Driver Dual-Protection Scheme for 1.2-kV, 400-A SiC MOSFET Modules" Mar. 2020 (Year: 2020).*
International Search Report and Written Opinion in International Appln. No. PCT/IB2021/052690, mailed on Jul. 12, 2021, 11 pages.

(Continued)

*Primary Examiner* — Kevin J Comber
(74) *Attorney, Agent, or Firm* — Fish & Richardson P.C.

(57) ABSTRACT

A fast short circuit detection method for detection of a short circuit at a gate-controlled power switch, said method comprising the steps of providing a measurement signal in response to a voltage drop along a stray inductance of the gate-controlled power switch; and generating a short circuit detection signal if the provided measurement signal exceeds a reference voltage and the gate-controlled power switch is in a switched-on state.

12 Claims, 12 Drawing Sheets

(56) References Cited

OTHER PUBLICATIONS

Sun et al., "Design, Analysis, and Discussion of Shortcircuit and Overload Gate-Driver Dual-Protection Scheme for 1.2-kV, 400 A SiC MOSFET Modules," IEEE Transactions on Power Electronics, Mar. 2020, 35(3):3054-3068, 15 pages.
JP OA—Japanese Patent Office, Office Action in Japanese Appln. No. 2023-560447, dated Nov. 26, 2024, 9 pages (with English translation).

\* cited by examiner

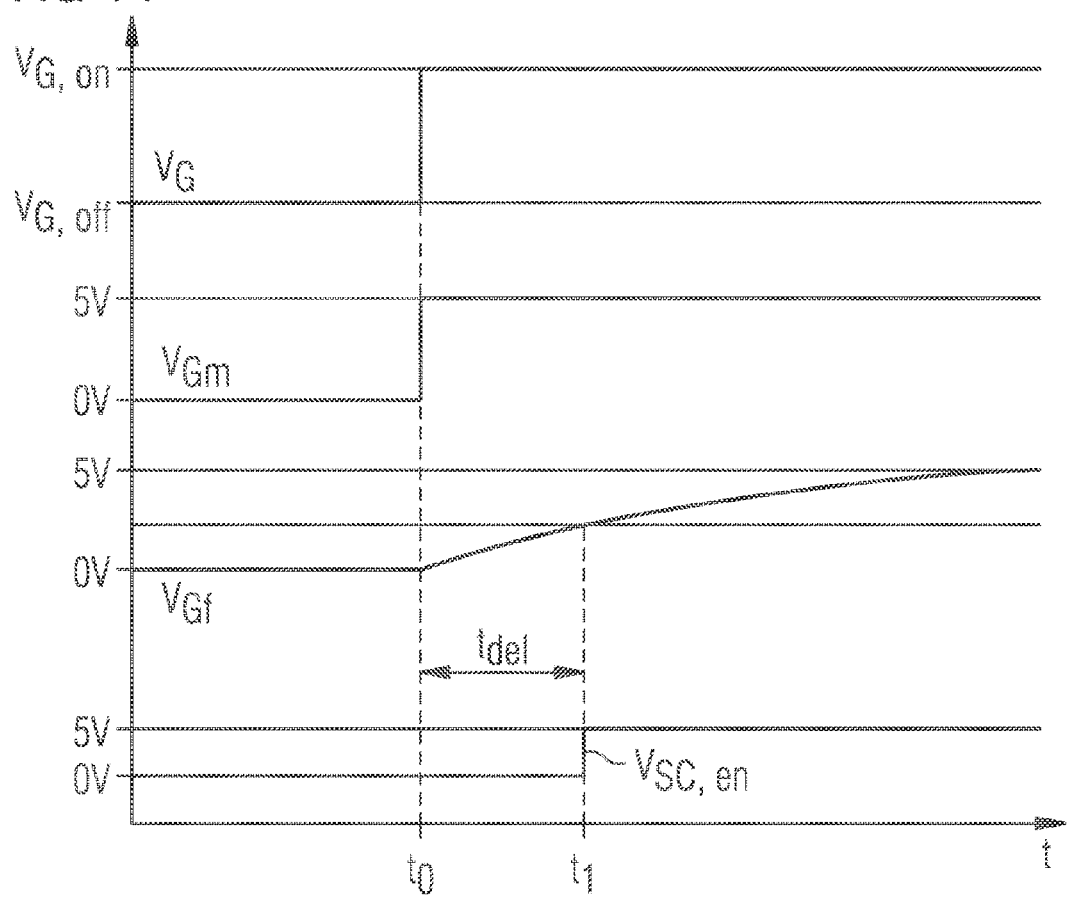

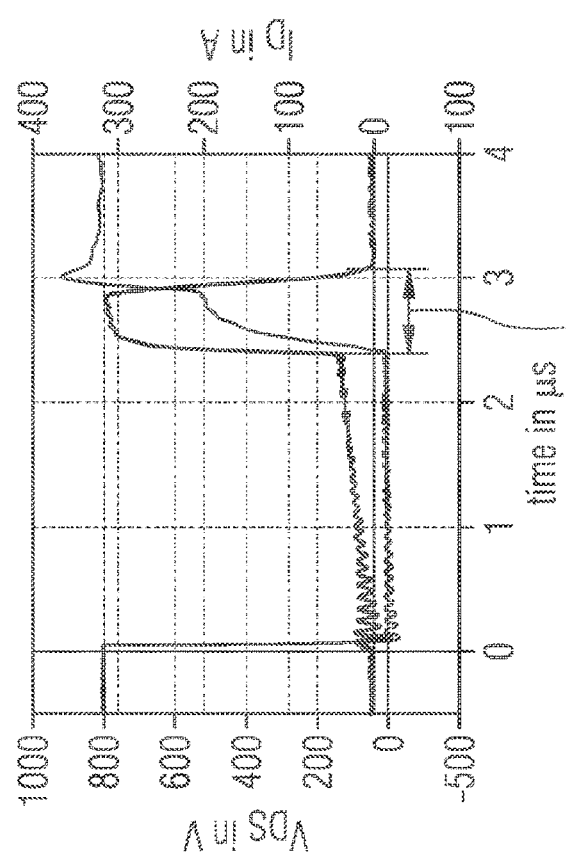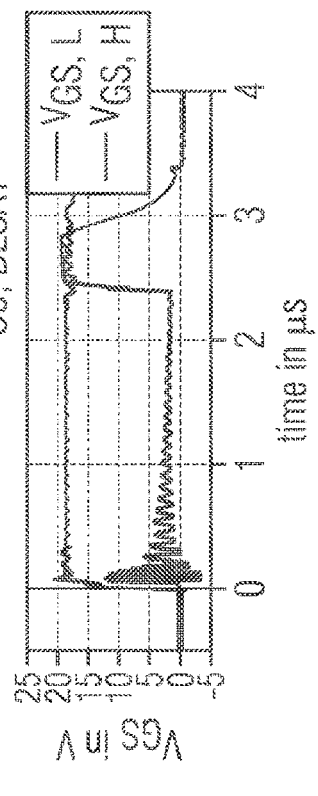
FIG 13A
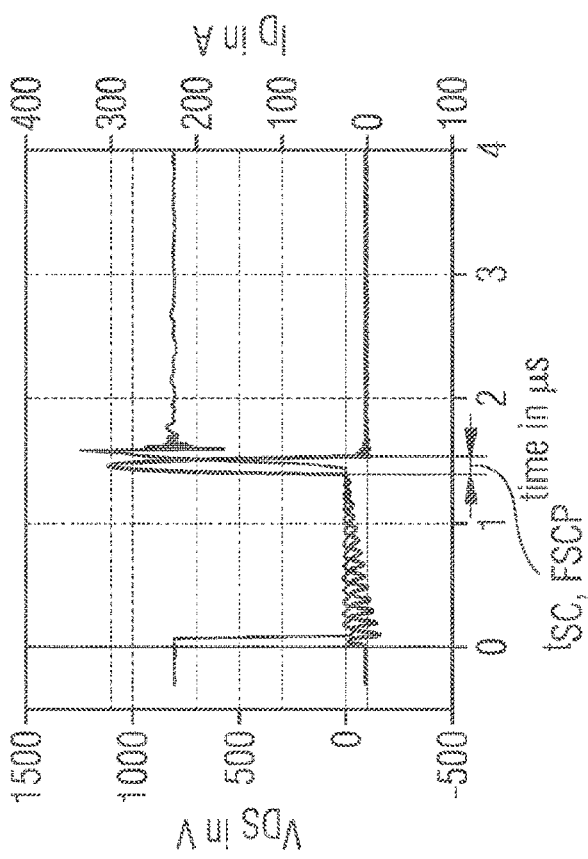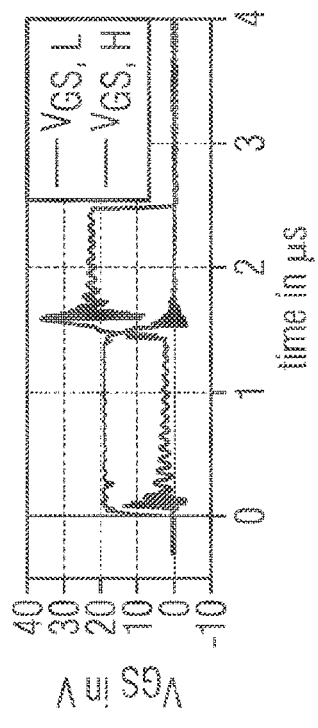
FIG 13B

METHOD AND APPARATUS FOR FAST SHORT CIRCUIT DETECTION OF A SHORT CIRCUIT AT A GATE-CONTROLLED POWER SWITCH

CROSS-REFERENCE TO RELATED APPLICATIONS

This nonprovisional application is a continuation application of International Patent Application No. PCT/IB2021/052690 filed on Mar. 31, 2021, the entire contents of which are hereby incorporated by reference.

BACKGROUND OF THE INVENTION

1. Technical Field

The invention relates to a method and apparatus for detection of a short circuit at a gate-controlled power switch, in particular a silicon carbide or a gallium nitride MOSFET.

2. Description of Related Art

There are different kinds of conventional detection methods for detection of a short circuit at a gate-controlled power switch.

With a conventional saturation detection method, the drain source voltage between the drain and source terminal of the MOSFET is sensed through a diode. When the sensed drain voltage is not dropping to its saturation voltage during the turn-on transient, a failure can be detected. This detection requires a relative careful design, and is highly temperature-dependent. It also requires saturation in case of MOSFETs and desaturation in case of IGBTs.

Another conventional detection method comprises the detection of a short circuit by comparing the gate charge at the gate with the gate source voltage between the gate and source terminal of the gate-controlled power switch. The gate charge can for instance be acquired by sensing the gate current using a current mirror configuration or measuring a voltage drop across the gate resistance.

A further possible way for short circuit detection is to perform a direct current measurement of the flowing electrical current.

BRIEF DESCRIPTION OF THE DRAWINGS

FIG. 11 shows signal diagrams to illustrate a possible exemplary embodiment of a method and apparatus according to the invention disclosed herein;

FIGS. 13A,B show further signal diagrams to illustrate experimental results for another short circuit scenario to illustrate the operation of a method and apparatus according to the invention disclosed herein;

DETAILED DESCRIPTION

Figure 1:
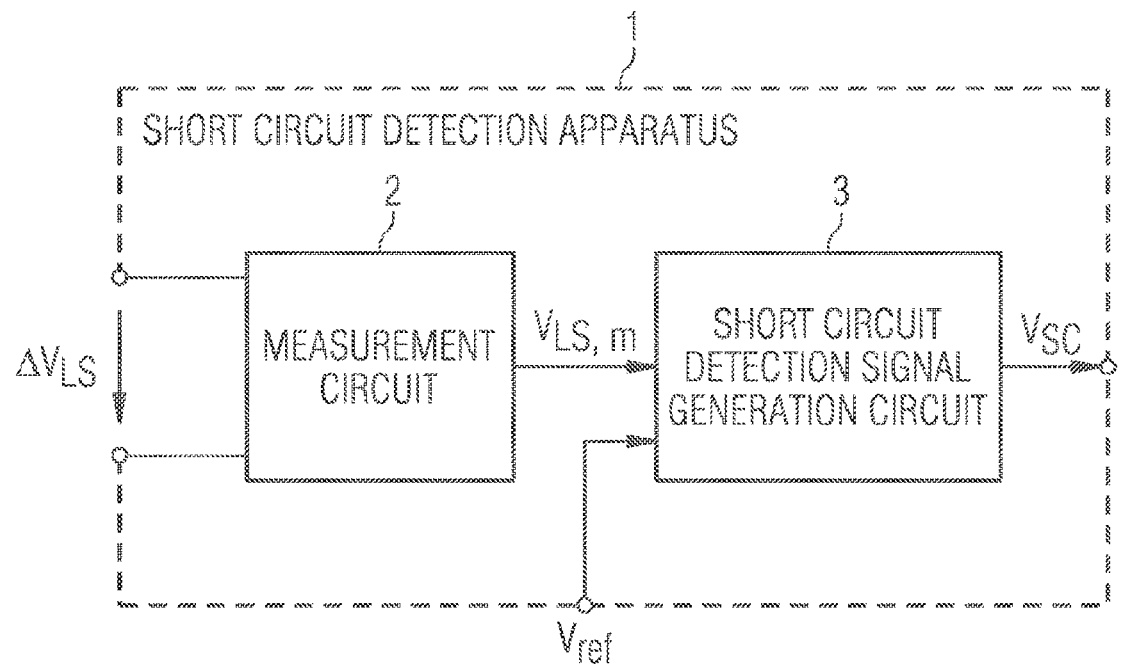
FIG. 1 shows a block diagram to illustrate a possible exemplary embodiment of a short circuit detection apparatus according to an aspect of the invention disclosed herein.

As can be seen from the schematic block diagram of FIG. 1, a short circuit detection apparatus 1 according to an aspect of the invention disclosed herein comprises in the illustrated exemplary embodiment a measurement circuit 2 and a short circuit detection signal generation circuit 3. The short circuit detection apparatus 1 as shown in the block diagram of FIG. 1 can be used for a short circuit detection at a gate-controlled power switch such as a MOSFET. The measurement circuit 2 of the apparatus 1 is adapted to generate a measurement signal $V_{LS,m}$ in response to a voltage drop $\Delta V_{LS}$ along a stray inductance $L_S$ of the respective gate-controlled power switch 4. The short circuit detection signal generation circuit 3 of the apparatus 1 is adapted to generate a short circuit detection signal $V_{SC}$ if the measurement signal $V_{LS,m}$ does exceed a reference voltage $V_{ref}$ and the gate-controlled power switch 4 is in a switched-on state. The measurement circuit 2 of the apparatus 1 can be connected to the gate-controlled power switch 4 integrated in a package comprising in a possible embodiment a Kelvin source pin S' used to tap the voltage drop $\Delta V_{LS}$ along the stray inductance $L_S$ between the Kelvin Source pin and the Source pin of the gate-controlled power switch 4 by the measurement circuit 2 of the short circuit detection apparatus 1. The gate-controlled power switch 4 tapped by the measurement circuit 2 can comprise a MOSFET, in particular a SiC MOSFET or a GaN MOSFET or a GaN HEMT. Further, the gate-controlled power switch 4 can also comprise for instance an IGBT.

Figure 2:
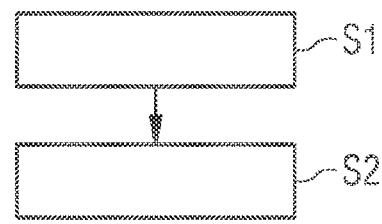
FIG. 2 shows an abstract flowchart to illustrate a possible exemplary embodiment of a fast short circuit detection method according to a further aspect of the invention disclosed herein.

FIG. 2 shows a flowchart to illustrate a possible exemplary embodiment of a fast short circuit detection method for detection of a short circuit at a gate-controlled power switch according to a further aspect of the invention disclosed herein. In the illustrated exemplary embodiment, the fast short circuit detection method comprises two main steps.

In a first step S1, a measurement signal $V_{LS,m}$ is provided in response to a voltage drop $\Delta V_{LS}$ along a stray inductance $L_S$ of the gate-controlled power switch 4 such as a MOSFET.

Figure 4:
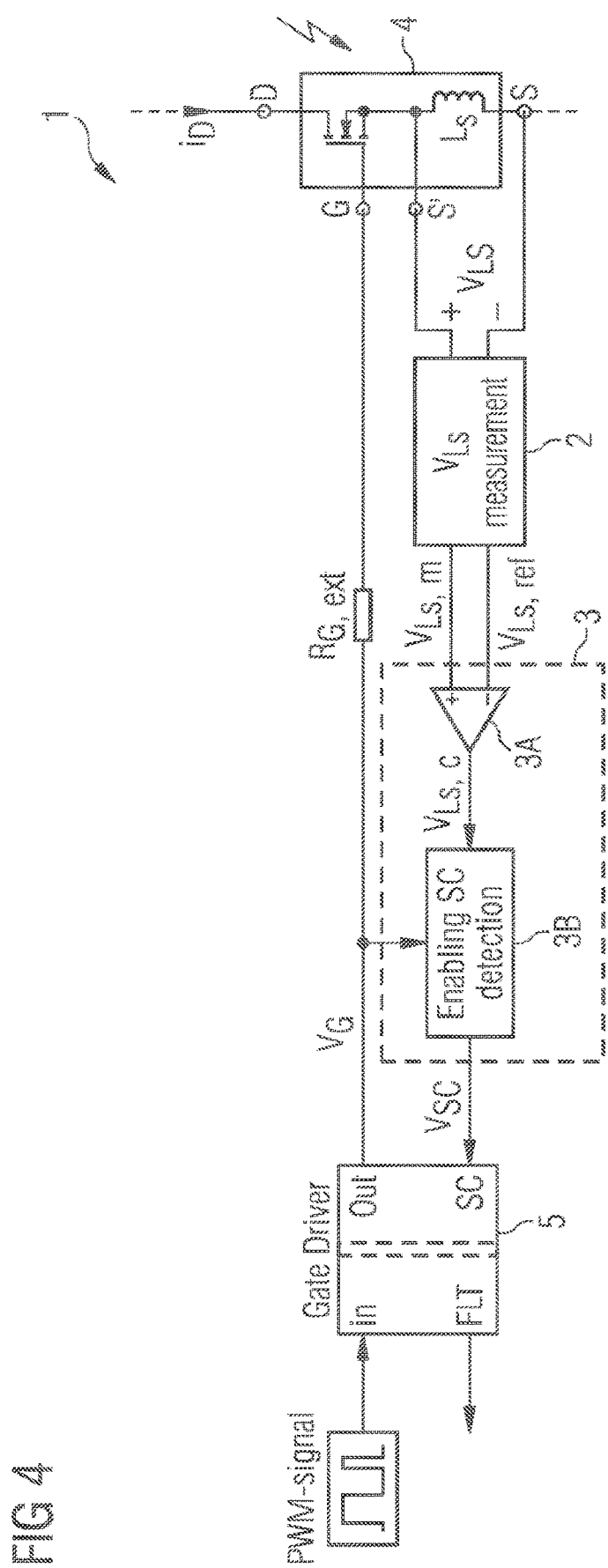
FIG. 4 shows a diagram to illustrate a possible embodiment of the method and apparatus according to the invention disclosed herein.

In a further step S2, a short circuit detection signal $V_{SC}$ is generated automatically if the provided measurement signal $V_{LS,m}$ does exceed a reference voltage $V_{ref}$ and the gate-controlled power switch 4 is in a switched-on state. In a possible embodiment, the stray inductance $L_S$ providing the voltage drop comprises a stray inductance at a source terminal S of the gate-controlled power switch 4. In a possible embodiment, the generated short circuit detection signal $V_{SC}$ output by the short circuit detection signal generation circuit 3 can be supplied to an input of a gate driver circuit 5 as illustrated in FIG. 4 to trigger an automatic switch-off of the gate-controlled power switch 4 by the gate driver circuit 5 within a predefined switch-off period. Most gate drivers comprise an SC detection input.

Figure 3A:
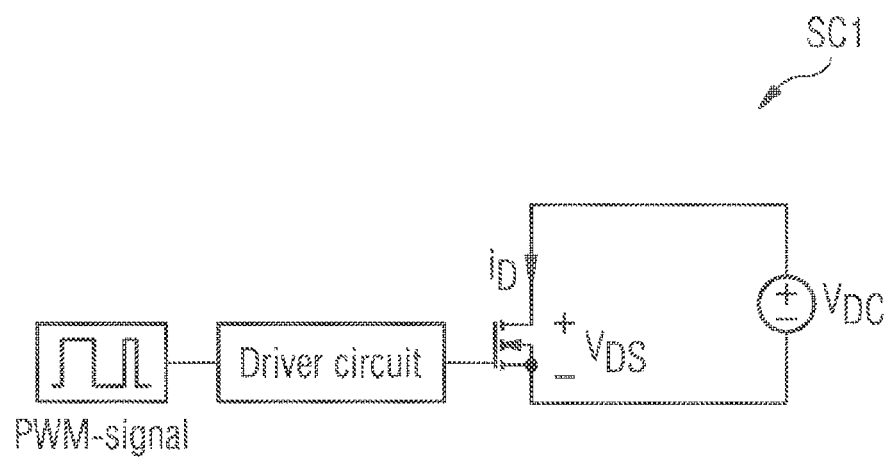
FIGS. 3A, 3B show different types of short circuits within a power electronic system to illustrate the operation of a fast short circuit detection method according to the invention disclosed herein.
Figure 3B:
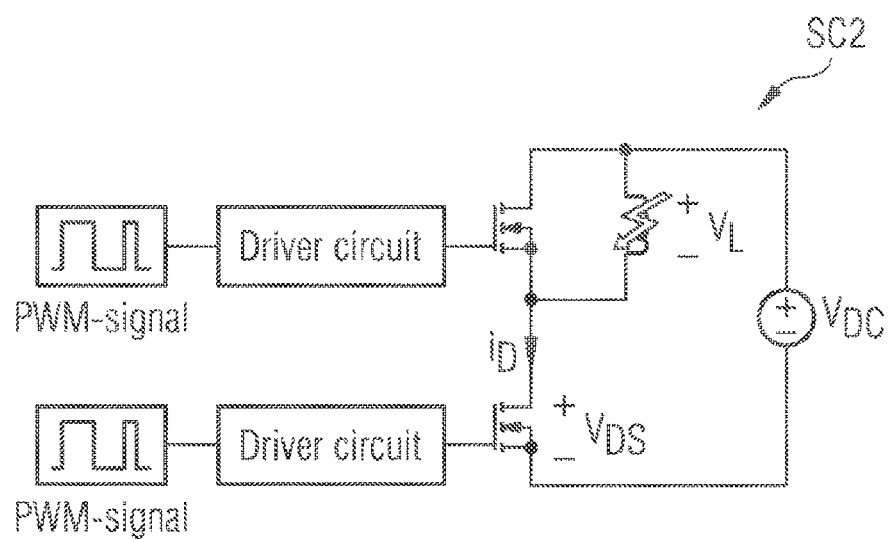

FIGS. 3A, 3B show different examples of possible types of short circuits within a power electronic system.

The gate-controlled power switch 4 can comprise different kinds of materials. Different materials for power devices such as silicon carbide SiC or gallium nitride GaN provide for a gate-controlled power switch 4 having faster switching capabilities to reduce power losses and increase efficiency. However, during a short circuit situation, a current density of the electrical current flowing through the gate-controlled power switch 4 can be extremely high and may provoke a high increase of its junction temperature. This in turn results in a high stress of the gate-controlled power switch 4 and does limit its short circuit withstand capability. Since the gate-controlled power switch 4 has a reduced short circuit withstand capability, the reliability of the entire power electronic system is reduced. The fast short circuit detection method according to the invention disclosed herein allows for a fast detection of a short circuit SC at the gate-controlled power switch 4 within a predefined reaction time of e.g. less than 300 nanoseconds. The implementation of the fast short circuit detection method according to the invention disclosed herein requires only a simple circuitry thus improving the reliability of the power electronic system. With the implementation of the fast short circuit detection method according to the invention disclosed herein, it is possible to use sophisticated gate-controlled power switches such as silicon carbide SiC power switches or gallium nitride GaN power switches.

In a power electronic system, there are two common types of possible short circuits SC which may be defined as follows. A first short circuit type SC1 comprises a hard switch fault HSF. In this scenario, the device is turned on with an already existing short circuit SC as also illustrated in FIG. 3A. The power device is driven by a driver circuit receiving for instance a PWM signal from a microcontroller. Another type of short circuit comprises a fault under load FUL. In this scenario, the short circuit SC does occur when the power device is in a conduction state as illustrated in FIG. 3A. In the illustrated scenario of FIG. 3B, two gate-controlled power switches 4 receive complementary PWM signals through driver circuits. If one of the two gate-controlled power switches 4 is in an on-state (conduction state) and there is a short circuit at the load of the other gate-controlled power switch 4, a fault under load FUL does occur.

The fast short circuit detection method according to the invention disclosed herein is adapted to detect a short circuit SC at the gate-controlled power switches 4 as illustrated for example in FIGS. 3A, 3B using the voltage drop $\Delta V_{LS}$ along the stray inductance $L_S$ of the gate-controlled power switch 4. In a possible embodiment, the voltage drop $\Delta V_{LS}$ can be measured between the source and driver source pin. In a possible embodiment, the short circuit detection can be activated using the output voltage of the gate driver connected to the gate terminal of the gate-controlled power switch 4. In this embodiment, the short circuit detection apparatus 1 according to the invention disclosed herein is only active when the gate-controlled power switch 4 is in a switched-on state.

FIG. 4 shows a circuit diagram to illustrate a possible exemplary embodiment of a short circuit detection apparatus 1 according to the invention disclosed herein. In this embodiment, the short circuit detection apparatus 1 according to the invention disclosed herein is used for a short circuit detection at a gate-controlled power switch 4. In the illustrated embodiment, the gate-controlled power switch 4 can be a MOSFET as shown in FIG. 4. The gate-controlled power switch 4 can also comprise other devices, in particular power switches such as IGBTs, GaN (HEMT) or SiCMOS, etc. integrated in different packages as discrete or integrated power modules. In the illustrated embodiment, the gate-controlled power switch 4 is integrated in a package having several connection pins. The gate-controlled power switch 4 comprises a gate G, a drain D and a source S. As illustrated in FIG. 4, the gate-controlled power switch 4 integrated in the package comprises an additional Kelvin source pin S' which allows to measure the voltage along the stray inductance $L_S$ at the source S of the gate-controlled power switch 4. The voltage drop $\Delta V_{LS}$ along the stray inductance $L_S$ of the gate-controlled power switch 4 is applied to the input of the measurement circuit 2 of the short circuit detection apparatus 1 as illustrated in FIG. 4. The measurement circuit 2 is adapted to generate the measurement signal $V_{LS,m}$ in response to the received voltage drop $\Delta V_{LS}$ along the stray inductance $L_S$ of the gate-controlled power switch 4. The short circuit detection signal generation circuit 3 connected to the measurement circuit 2 is adapted to generate a short circuit detection signal $V_{SC}$ if the measurement signal $V_{LS,m}$ received from the measurement circuit 2 does exceed a reference voltage $V_{ref}$ and if the gate-controlled power switch 4 is in a switched-on state. The measurement circuit 2 is connected to the gate-controlled power switch 4 integrated in the package comprising the Kelvin source pin S' which is used to tap the voltage drop $\Delta V_{LS}$ along the stray inductance $L_S$ of the gate-controlled power switch 4 by the measurement circuit 2.

In the embodiment shown in FIG. 4, the short circuit detection signal generation circuit 3 comprises two main components, i.e. a comparator circuit 3A and an enabling SC detection circuit 3B. The measurement signal $V_{LS,m}$ generated by the measurement circuit 2 is compared by the comparator circuit 3A of the short circuit detection signal generation circuit 3 with the reference voltage $V_{ref}$ to generate a comparator output signal $V_{LS,c}$ as shown in FIG. 4. This comparator output signal $V_{LS,c}$ is applied to the enabling SC detection circuit 3B as shown in FIG. 4.

Figure 10:
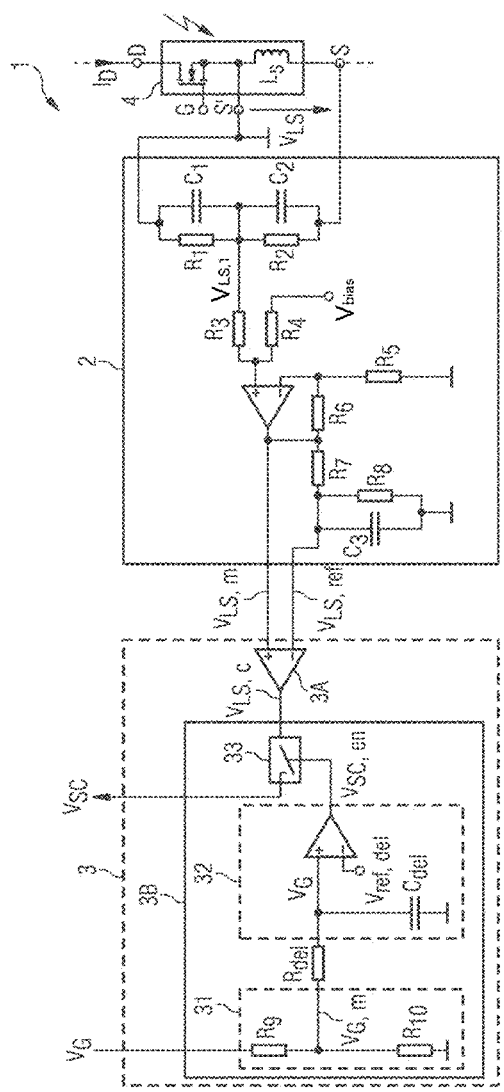
FIG. 10 shows a circuit diagram to illustrate a possible exemplary embodiment of an apparatus according to the invention disclosed herein.

A possible implementation of the enabling SC detection circuit 3B is shown in the circuit diagram of FIG. 10. In the illustrated embodiment of FIG. 10, the SC detection signal generation circuit 3 comprises an enabling SC detection circuit 3B having a voltage divider circuit 31, a signal delay circuit 32 and a logic gate 33. As illustrated in the circuit diagram of FIG. 10, the enabling SC detection circuit 3B can comprise a voltage divider circuit 31 having to resistors R9,R10 which is adapted to measure an output voltage of a gate control signal $V_G$ output by a gate driver circuit 5 and supplied to a gate terminal G of the gate-controlled power switch 4 through a gate resistor to provide a measured gate voltage $V_{G,m}$. Further, the enabling SC detection circuit 3B can comprise a signal delay circuit 32 which is adapted to delay the measured gate voltage $V_{G,m}$ with a predefined delay time $t_{del}$ to provide a short circuit detection enable signal $V_{SC,en}$ as shown in the circuit diagram of FIG. 10. Further, the enabling SC detection circuit 3B can comprise a logic gate 33. The comparator output signal $V_{LS,c}$ output by the comparator circuit 3A can be supplied via this logic gate 33 as the short circuit detection signal $V_{SC}$ to an input SC of a gate driver circuit 5 if the logic gate 33 is enabled by the short circuit detection enable signal $V_{SC,en}$ received from the comparator of the signal delay circuit 32.

FIG. 4 shows the short circuit detection signal $V_{SC}$ supplied to the input SC of the gate driver circuit 5. The generated short circuit detection signal $V_{SC}$ generated by the short circuit detection signal generation circuit 3 is supplied to the input SC of the gate driver circuit 5 to trigger an automatic switch-off of the gate-controlled power switch 4 by the gate driver circuit 5 within a predefined switch-off period. The gate control signal $V_G$ output by the gate driver circuit 5 is applied to the gate terminal G of the gate-controlled power switch 4 as illustrated in FIG. 4. In a possible embodiment, the gate control signal $V_G$ output by the gate driver circuit 5 can be applied via a resistor $R_{Gext}$ to the gate terminal G of the gate-controlled power switch 4.

In a possible embodiment, the gate control signal $V_G$ output by the gate driver circuit 5 can be measured by means of the voltage divider circuit 31 of the enabling SC detection circuit 3B as illustrated in the circuit diagram of FIG. 10. This measured gate voltage $V_G$ is delayed by the delay circuit 32 of the enabling SC detection circuit 3B with a delay time $t_{del}$ to provide a short circuit detection enable signal $V_{SC,en}$ by means of a comparator as shown in FIG. 10. The comparator output signal $V_{LS,c}$ output by the comparator circuit 3A can be supplied via the logic gate 33 as the short circuit detection signal $V_{SC}$ to the input SC of the gate driver circuit 5 if the logic gate 33 is enabled by the short circuit detection enable signal $V_{SC,en}$ received from the signal delay circuit 32. In a possible implementation, the logic gate 33 can comprise an AND gate which receives as a first input the comparator output signal $V_{LS,c}$ output by the comparator circuit 3A and as a second input signal the short circuit detection enable signal $V_{SC,en}$ output by the comparator of the signal delay circuit 32 provided within the enabling SC detection circuit 3B. The output of the AND gate 33 can be connected to the SC input of the gate driver circuit 5 to carry the short circuit detection signal $V_{SC}$.

In a possible embodiment, the gate control signal $V_G$ applied by the gate driver circuit 5 to the gate terminal G of the gate-controlled power switch 4 can comprise any modulating pulse or signal, in particular a pulse width modulated, PWM, signal, received from a signal source, in particular from a microcontroller as also shown in FIG. 4. The gate driver circuit 5 can generate a fault indication signal FLT when an automatic switch-off of the gate-controlled power switch 4 has been performed by the gate driver circuit 5. In the illustrated embodiment of FIG. 4, the reference voltage $V_{ref}$ supplied to the comparator circuit 3A can comprise an internal reference voltage which may be derived from a steady-state voltage of the measurement signal $V_{LS,m}$. In an alternative embodiment, the reference voltage $V_{ref}$ can also be generated by a separate reference voltage source.

The gate-controlled power switch 4 can comprise a driver source pin such as the power source pin S as shown in FIG. 4. The stray inductance $L_S$ between the two pins is a result of the mechanical interconnection and can be in the range of several nanoHenrys. During switching transients of the gate-controlled power switch 4, i.e. turn-on and turn-off of the gate-controlled power switch 4, the electrical current $I_D$ flowing through the gate-controlled power switch 4 does change rapidly in a range of nanoseconds and has as a result a voltage drop $\Delta V_{LS}$ along the stray inductance $L_S$ between the pins S, S' as follows:

$$V_{LS} = L_S \times dID/dt$$

Figure 5:
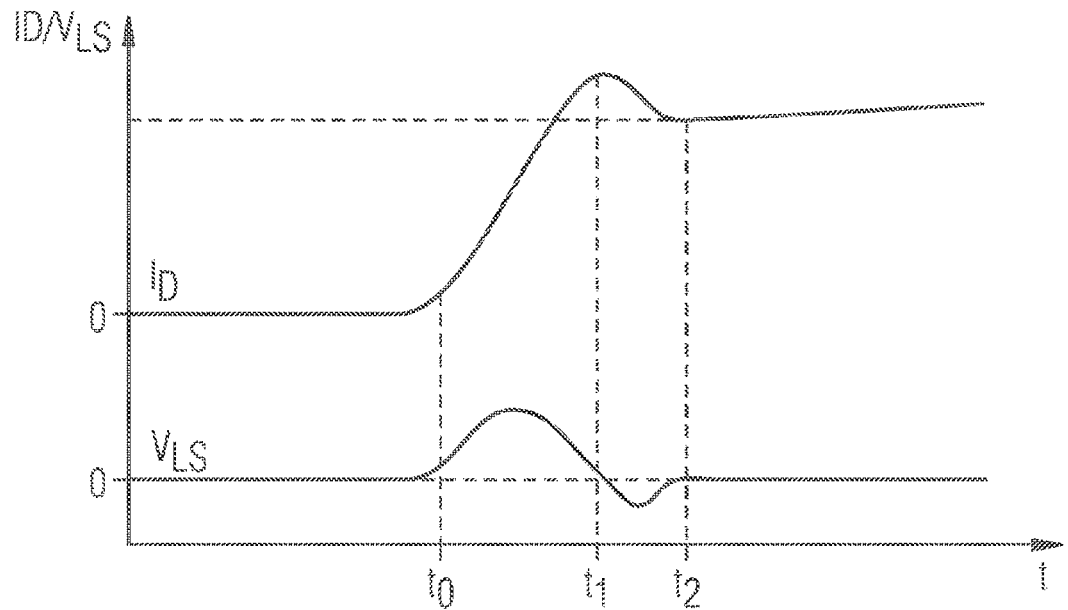
FIG. 5 shows signal diagrams to illustrate the operation of a method and apparatus according to the invention disclosed herein.

By measuring the measurement signal $V_{LS,m}$ one gets the information whether the drain current $I_D$ has changed rapidly from a normal operation condition or not and also about its duration. With a slow variation of the electrical current the measurement signal $V_{LS,m}$ is close to 0 V. FIG. 5 shows an example of waveforms during a turn-on transient of the gate-controlled power switch 4. Between the time $t_0$ and $t_1$, the electrical current $I_D$ does increase from zero to its nominal value (dI/dt>>0) which lasts normally in a range of several nanoseconds. The measurement signal $V_{LS,m}$ increases according to the above given equation. During time $t_1$ and $t_2$, the electrical current $I_D$ decreases (dI/dt<<0) and the measurement signal $V_{LS,m}$ does change its polarity from positive to negative. In a normal operation condition of the gate-controlled power switch 4, the switching time period $(t_1-t_0)$ is limited and known. In the on-state of the gate-controlled power switch 4 ($t>t_2$), the electrical current $I_D$ does increase slowly depending upon its load and dID/dt is close to zero resulting in a measurement signal $V_{LS,m}$ being approximately close to 0 V as illustrated in FIG. 5.

In case of a short circuit scenario as illustrated in FIG. 3A, the switching time $(t_1-t_0)$ of the electrical current $I_D$ does drastically increase and it is reflected in the duration of the voltage drop $V_{LS}$. During the turn-on transient, a long duration of $V_{LS,m}$ (i.e. longer than normal) can be used as an indicator of the first switching scenario, i.e. the short circuit type SC1 being a hard switch fault HSF as shown schematically in FIG. 3A. In case of another short circuit scenario SC2 as shown in FIG. 3B, i.e. fault under load FUL, the electrical current $I_D$ does rapidly increase (dI/dt>>0) when the device has already passed the switching time ($t>t_2$) and therefore the measurement signal $V_{LS,m}$ does increase, too. Any increment of $V_{LS,m}$ for the time $t>t_2$ can be used as an indicator of such a failure. In a possible embodiment, the duration of $V_{LS,m}$ can be used to detect either a short circuit type SC1 or a short circuit type SC2 as illustrated in FIGS. 3A, 3B.

Figure 6:
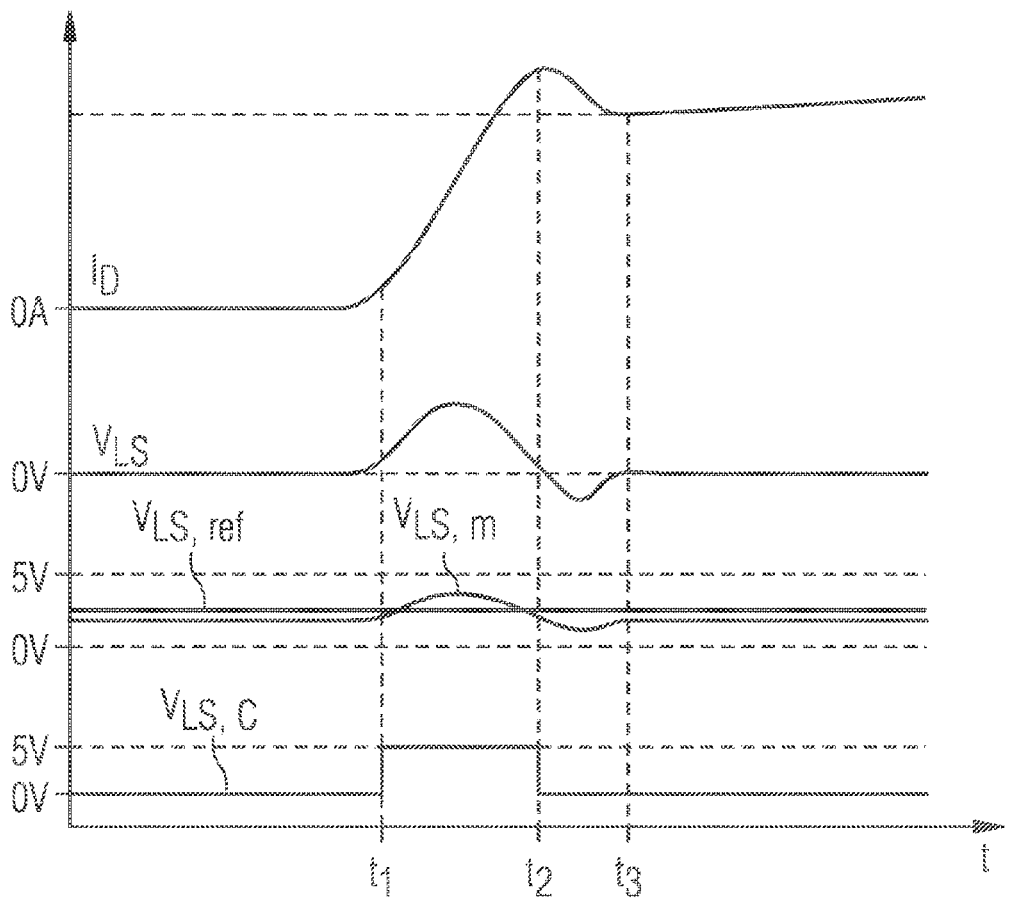
FIG. 6 shows further signal diagrams for illustrating the operation of a method and apparatus according to the invention disclosed herein.

In a possible embodiment, the measurement signal $V_{LS,m}$ can be measured and adapted using a simple circuitry as implemented in the block 2 shown in the circuit diagram of FIG. 4. The measurement signal $V_{LS,m}$ output by the measurement circuit 2 can be compared with a reference voltage $V_{LS,ref}$ as shown in FIG. 4. The value of the reference voltage $V_{LS,ref}$ can be slightly higher than the steady-state value of the measurement signal $V_{LS,m}$. The output signal of the comparator 3A, i.e. the comparator output signal $V_{LS,c}$, can be a squareshaped signal having a duration which is proportional to the duration of the measurement signal $V_{LS,m}$ and consequently proportional to the duration of the electrical current ID as also illustrated schematically in the signal diagrams of FIG. 6. In this embodiment, the comparator output signal $V_{LS,c}$ can be used as an indicator of a short circuit SC. An example of this procedure during a turn-on transient is illustrated in the signal diagrams of FIG. 6.

In a preferred embodiment, the short circuit detection method is activated just during a switch-on state of the observed gate-controlled power switch 4. Accordingly, the short circuit detection signal $V_{SC}$ is only generated if the provided measurement signal $V_{LS,m}$ does exceed a reference voltage $Vls_{,ref}$ and if the gate-controlled power switch 4 is at the same time in a switched-on state. Accordingly, in a possible embodiment, the short circuit detection method according to the invention disclosed herein is activated just during the on-state period of the gate-controlled power switch 4. In a possible embodiment, the method is enabled by using an output signal of the gate driver circuit 5, i.e. the gate driver signal $V_G$ as shown in FIG. 4. This voltage $V_G$ can be measured and an enable signal $V_{SC,en}$ can be set high from nanoseconds after a positive edge of the gate control signal $V_G$ output by the gate driver circuit 5 to avoid a false positive detection during the turn-on transient. In a possible embodiment, the delay time $t_{del}$ between the positive edge of the gate control signal $V_G$ and the enable signal can be adjustable and can depend on a switching time of the gate-controlled power switch 4 during normal operation. Consequently, the short circuit detection provided by the method according to the invention disclosed herein is enabled in a preferred embodiment after the time required for a normal switching transient of the gate-controlled power switch 4.

Figure 7:
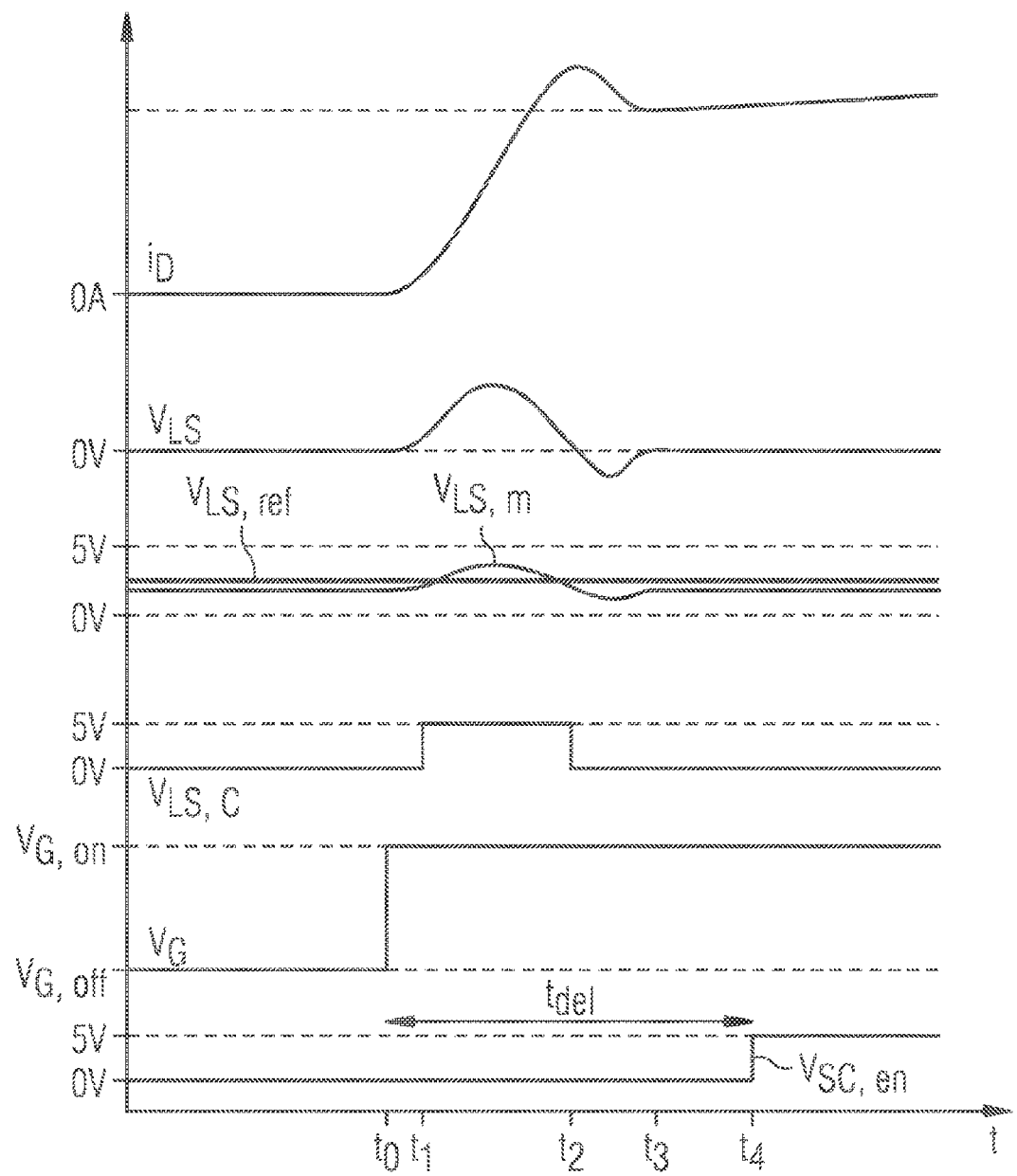
FIG. 7 shows further signal diagrams for illustrating a possible exemplary embodiment of a method and apparatus according to the invention disclosed herein.

FIG. 7 shows waveforms of a procedure for enabling the short circuit detection during a turn-on transient of the gate-controlled power switch 4. In the illustrated example, the gate-controlled power switch 4 is turned on with the gate control signal $V_G$ on-voltage $VG_{on}$ and turned off with the gate control off-voltage $VG_{off}$. The delay time $t_{del}$ is defined as the time period between time $t_0$ and time $t_4$ as illustrated in FIG. 7. Accordingly, in the illustrated example, after time $t=t_4$, the short circuit detection method according to the invention disclosed herein is enabled.

Figure 8:
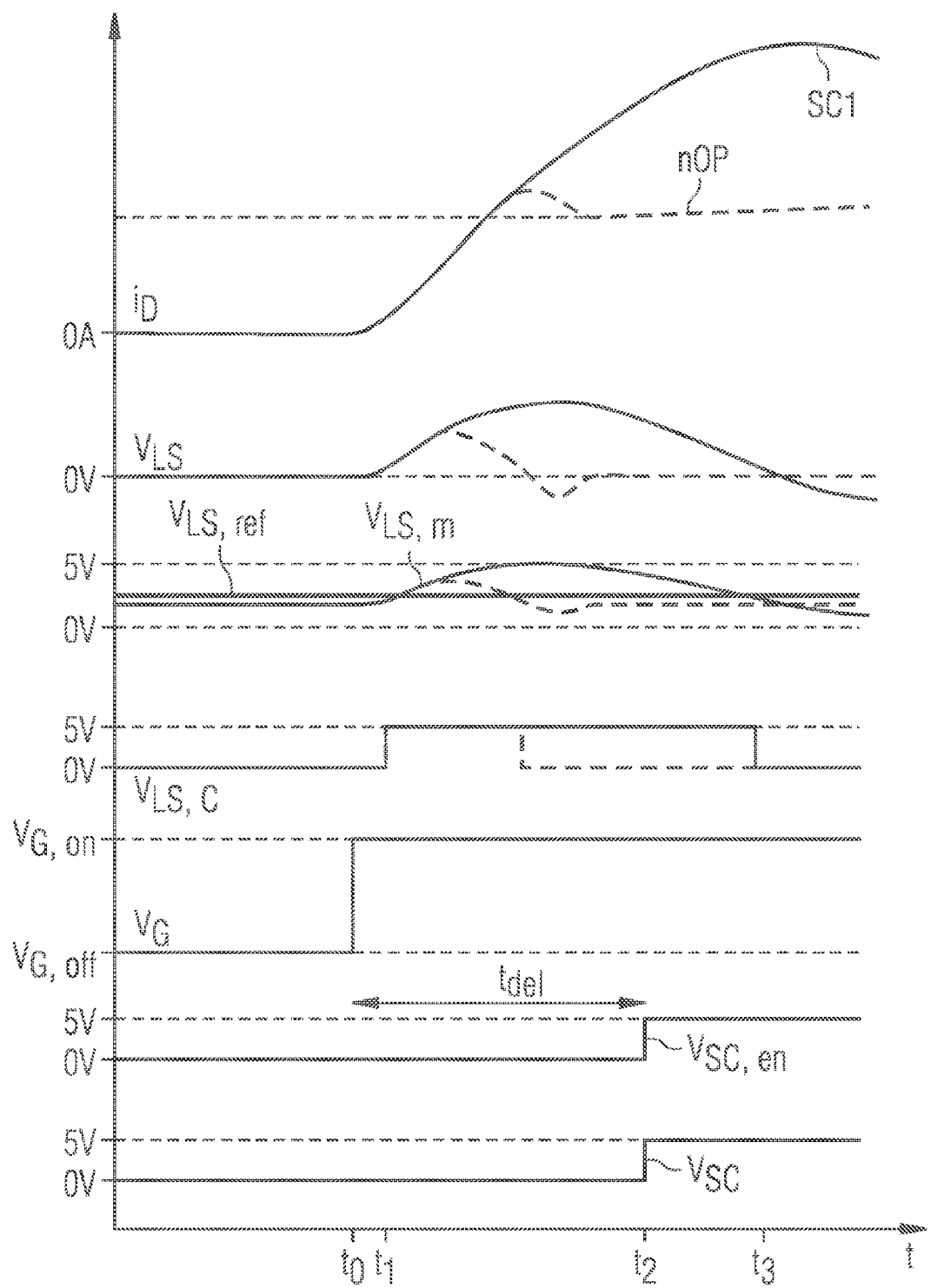
FIG. 8 shows further signal diagrams to illustrate a possible exemplary embodiment of a method and apparatus in case of SC type 1 according to the invention disclosed herein.

FIG. 8 shows exemplary waveforms for a short circuit detection method according to the invention disclosed herein in a short circuit scenario of the first type SC1 when compared to a normal operation nOP(dotted line). In the illustrated example, the gate-controlled power switch 4 is turned on at time $t=t_0$ and the output signal from the gate driver circuit 5 steps up from $VG_{off}$ to $VG_{on}$, i.e. from the off-voltage to the on-voltage of the gate control signal. At the same time, the electrical current $I_D$ flowing through the gate-controlled power switch 4 starts rising as well as the measurement signal $V_{LS,m}$. If the measurement signal $V_{LS,m}$ is higher than the reference voltage $V_{LS,ref}$ the comparator output signal $V_{LS,c}$ is set high too (at $t=t_1$). At time $t=t_2$, the delay time $t_{del}$ has passed and the short circuit detection mechanism according to the invention disclosed herein is activated setting the enable signal $V_{SC,en}$ to a high level. Due to the short circuit SC at the time $t>t_2$, the electrical current $I_D$ is still rising and therefore the signal $V_{LS,c}$ is still high in contrast to the no failure case. Both the signals $V_{LS,c}$, i.e. the comparator output signal, and the short circuit detection enable signal $V_{SC,en}$ are both at a high level which is an indicator of an occurred short circuit SC. As a result, the failure signal, i.e. the short circuit detection signal $V_{SC}$ is set high, too, indicating the detection of the occurred short circuit SC. In a possible embodiment, the signal $V_{SC}$ can be latched for a determined and adjustable time.

Figure 9:
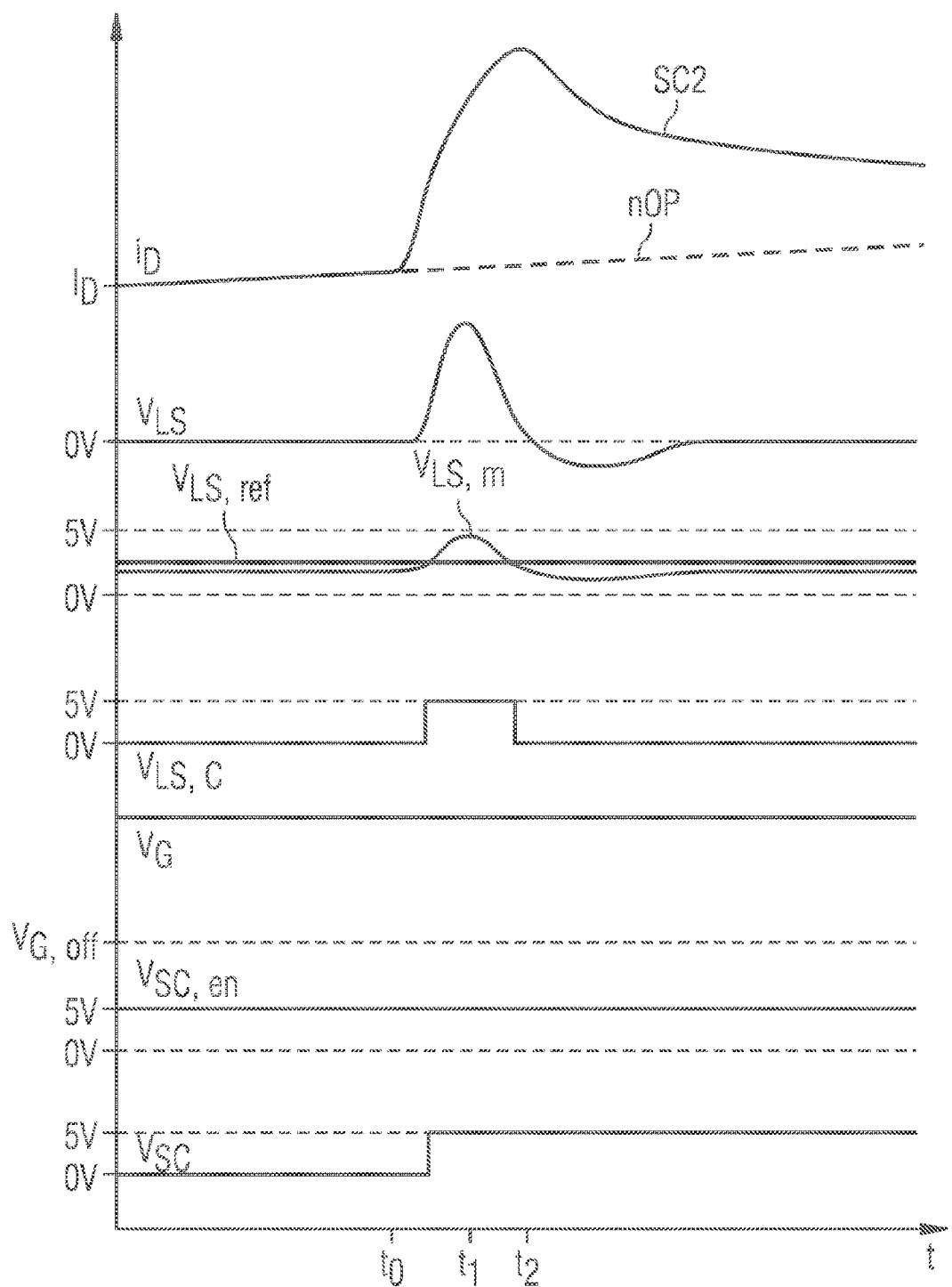
FIG. 9 shows further signal diagrams to illustrate the operation of a method and apparatus in case of SC type 2 according to the invention disclosed herein.

FIG. 9 shows exemplary waveforms for a short circuit detection of a short circuit of the second type SC2 when compared to a normal operation nOP(dotted line). In case that a short circuit of the second type II (SC2) does occur, the fast short circuit detection method according to the invention disclosed herein does operate in a similar way as in case of a short circuit of the first type SC1. An example of a short circuit scenario of the second type SC2 is presented in FIG. 9 where the electrical current $I_D$ during a normal operation is depicted in dotted line. In this case, the delay time $t_{del}$ is not there and the enable signal is already high. Accordingly, any pulse from the signal $V_{SC,c}$ can trigger the detection and set the failure signal, i.e. the short circuit detection signal $V_{SC}$, to a high value. Accordingly, the detection of a short circuit in the second scenario SC2 is faster than the detection of a short circuit in the first short circuit scenario SC1 due to the absence of the enabling delay time $t_{del}$.

FIG. 10 shows a possible exemplary implementation of a short circuit detection apparatus 1 according to the invention disclosed herein. The short circuit detection apparatus 1 is used for short circuit detection at the gate-controlled power switch 4 as shown in FIG. 10. The short circuit detection apparatus 1 comprises a measurement circuit 2 and a short circuit detection signal generation circuit 3. In a possible embodiment, the voltage drop $\Delta V_{LS}$ across the stray inductance $L_S$ of the gate-controlled power switch 4 is measured using a compensated voltage divider composed by resistors R1, R2 and capacitors C1, C2 as illustrated in FIG. 10.

With the compensate voltage divider of the measurement circuit 2 the resistance and the capacitance of the capacitors C1, C2 can be given by:

$$R1 \times C1 = R2 \times C2$$

In a possible implementation, the voltage divider of the measurement circuit 2 can be designed to have a voltage $V_{LS,1}$ in a range of −2.5 to 2.5 V. A bias voltage $V_{bias}$ can be added to this voltage $V_{LS,1}$ to create an offset thus avoiding the use of any negative power supply in the circuitry. The resulting voltage can be amplified by a factor 2 using a high frequency operational amplifier as shown in the circuit diagram of FIG. 10. The output of the operational amplifier forms the measurement signal $V_{LS,m}$ which can be in a range from 0 to 5 V with a steady-state voltage at 2.5 V. During the turn-on transient of the gate-controlled power switch 4, a high positive change of the electrical current dI/dt produces a voltage drop of $V_{LS,m}$ in a range of 0 to 2.5 V because in the illustrated embodiment the pin S' forms the ground of the illustrated circuit. The measurement signal $V_{LS,m}$ can be compared in the illustrated embodiment of FIG. 10 with a self-generated reference voltage $V_{ref}$ by means of the comparator circuit 3A as shown in FIG. 10. In the illustrated embodiment of FIG. 10, the reference voltage $V_{ref}$ comprises an internal reference voltage which is derived from a steady-state voltage of the measurement signal $V_{LS,m}$. In a possible implementation, the reference voltage $V_{LS,ref}$ can be around 90% of the steady-state voltage of the measurement signal $V_{LS,m}$. In this case, the reference voltage $V_{LS,ref}$ can be around 2.25 V and is stable due to capacitor C3 illustrated in FIG. 10. Accordingly, in the illustrated embodiment, the measurement circuit 2 is also adapted to generate an internal reference voltage derived from a steady-state voltage of the measurement signal $V_{LS,m}$ and supplied to the comparator circuit 3A of the short circuit detection signal generation circuit 3. In this kind of simple self-generated and stable reference voltage $V_{ref}$, any influence of the tolerance and temperature of the components such as the stray inductance $L_S$ or passive components and integrated circuits can be controlled. In case that a positive and a high current increase or change dI/dt does occur, the measurement signal $V_{LS,m}$ does fall below the derived reference voltage $V_{ref}$ and the comparator circuit 3A generates a comparator output signal $V_{LS,c}$ at a high signal level.

In a preferred embodiment, the short circuit SC detection is only activated during an on-state of the gate-controlled power switch 4. The output voltage of the gate driver circuit 5 can be measured and adjusted using a simple voltage divider circuit 31 having resistors R9,R10 within the enabling SC detection circuit 3B of the short circuit detection signal generation circuit 3. The resulting signal $V_{G,m}$ can be in a range of 0 V to 5 V. In the illustrated implementation of FIG. 10, the signal delay circuit 32 comprises a low-pass filter LPF which can be composed by a resistor $R_{del}$ and a capacitor Ca d used to provide a delay time $t_{del}$. The filtered output signal of the low-pass filter $V_{G,1}$ can be compared by a comparator of the signal delay circuit 32 with a reference voltage $V_{ref,del}$ as shown in the circuit of FIG. 10 to generate the short circuit detection enable signal $V_{SC,en}$ supplied to the logic gate 33 of the short circuit detection signal generation circuit 3B forming part of the short circuit detection signal generation circuit 3. Once the short circuit detection enable signal $V_{SC,en}$ is set high, the failure signal, i.e. the short circuit detection signal $V_{SC}$, can be triggered by the comparator output signal $V_{LS,c}$ output by the comparator circuit 3A to detect a short circuit having occurred at the gate-controlled power switch 4.

FIG. 11 shows exemplary waveforms to illustrate the operation of the enabling SC detection circuit 3B. In the illustrated embodiment, the logic gate 33 is formed by an AND logic gate. The components utilized in this embodiment can be suitable for a high frequency with extremely low propagation delay times in the range of less than 10 nanoseconds.

Figure 12A:
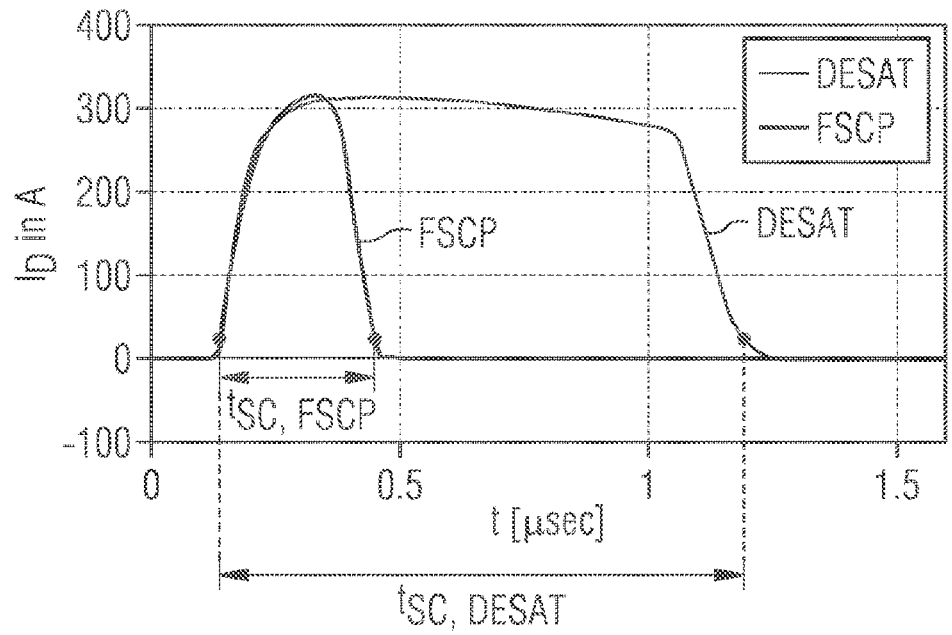
FIGS. 12A,B,C show signal diagrams to illustrate experimental results for a short circuit scenario to illustrate the operation of a method and apparatus according to the invention disclosed herein.
Figure 12B:
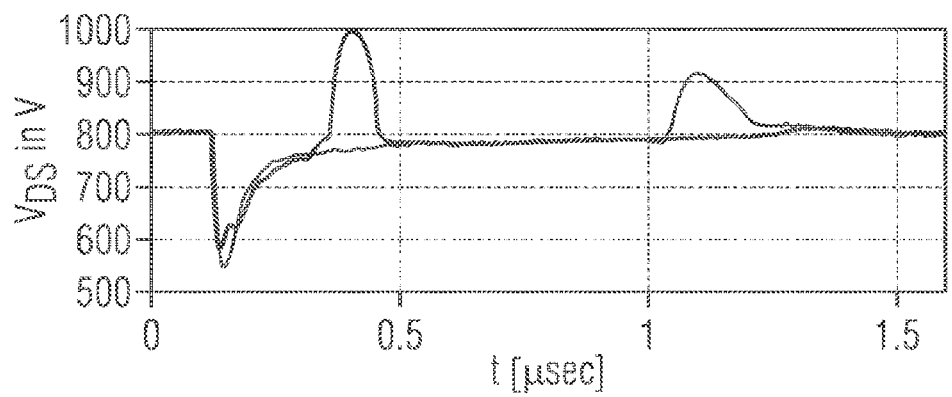
Figure 12C:
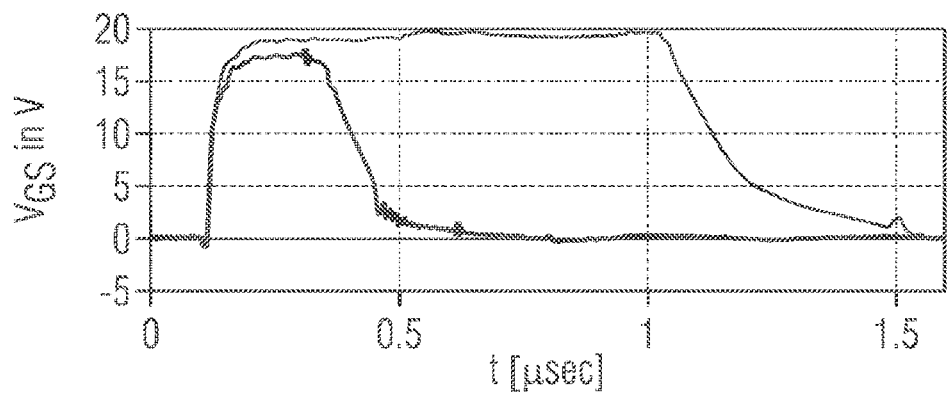

FIGS. 12A,B,C illustrate experimental results of a short circuit scenario of the first type SC1. FIG. 12A shows a drain current $I_D$, FIG. 12B illustrates the drain source voltage $V_{DS}$ and FIG. 12C illustrates the gate voltage $V_{GS}$. A conventional method may detect a short circuit SC after 950 nanoseconds and a total withstand time $t_{SC,desat}$ may be around 1.15 microseconds. In contrast, the fast short circuit detection method FSCP according to the invention disclosed herein can detect a short circuit SC around 200 nanoseconds after it has occurred by starting a soft turn-off procedure. The total withstand time $t_{SC,FSCP}$ is around only 300 nanoseconds, i.e. about four times faster than the conventional detection method.

The experimental results for the other short circuit detection scenario SC2 are illustrated in the signal diagrams of FIGS. 13A,B. FIG. 13A shows at the top the drain current with a drain source voltage at the gate-controlled power switch 4 and on the bottom the gate source voltage. With the fast short circuit detection method according to the invention disclosed herein as illustrated in FIG. 13A, a detection time of around 54 nanoseconds can be achieved where the total short circuit withstand time $t_{SC,FSCP}$ is around only 150 nanoseconds. In contrast, with a conventional detection method as illustrated in FIG. 13B, it can be detected only after 450 nanoseconds with a total time of around 750 nanoseconds. Consequently, the fast short circuit detection method according to the invention disclosed herein is in the second short circuit scenario SC2 around five times faster than the conventional method.

Figure 14:
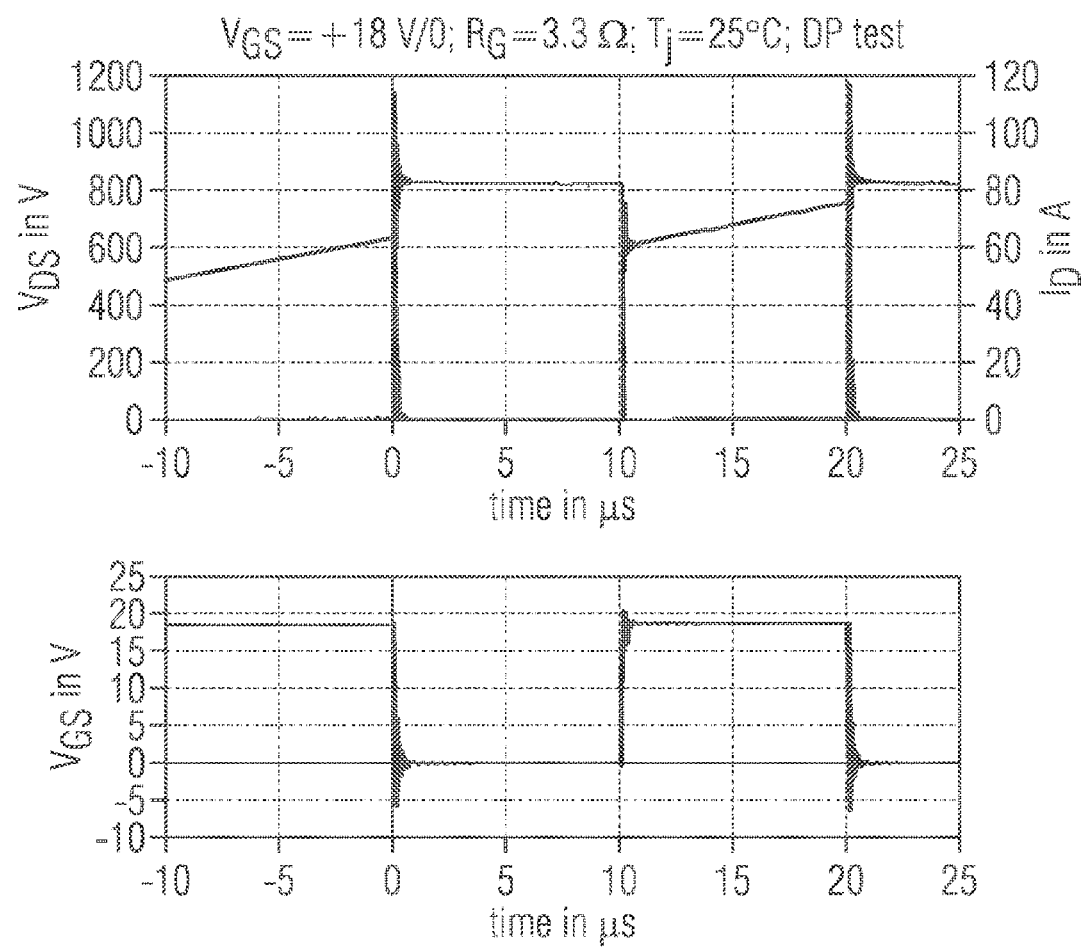
FIG. 14 shows signal diagrams to illustrate a double pulse test in a normal operation of a gate-controlled power switch.

The fast short circuit detection method according to the invention disclosed herein does not interfere with the normal switching transient of the gate-controlled power switch 4. To test this, a standard double pulse test has been performed with an SiC MOSFET device 4 of 80 milliohm and 1200 V. A maximum peak current for the gate-controlled power switch 4 is 60 A (taken from a datasheet). The experimental results are shown in the signal diagrams of FIG. 14. The top part of FIG. 14 shows the drain source voltage. The bottom part of FIG. 14 shows the gate voltages. The DC link voltage is 600 V and the drain current is more than 60 amps and no false positives are feasible. This does confirm the compatibility of the fast short circuit detection method according to the invention disclosed herein with a normal operation of the gate-controlled power switch 4.

The invention claimed is:

1. A short circuit detection apparatus used for short circuit detection at a gate-controlled power switch,
    said apparatus comprising
        a measurement circuit adapted to generate a measurement signal in response to a voltage drop along a stray inductance of the gate-controlled power switch and
        a short circuit detection signal generation circuit adapted to generate a short circuit detection signal if the measurement signal exceeds a reference voltage and the gate-controlled power switch is in a switched-on state,
    wherein the short circuit detection signal generation circuit comprises a comparator circuit which is adapted to compare a measurement signal generated by the measurement circuit with the reference voltage to generate a comparator output signal and an enabling short circuit detection circuit having:
        a voltage divider circuit adapted to measure an output voltage of a gate control signal output by a gate driver circuit and supplied to a gate terminal of the gate-controlled power switch to provide a measured gate voltage,
        a signal delay circuit adapted to delay the measured gate voltage with a delay time to provide a short circuit detection enable signal, and having
        a logic gate wherein the comparator output signal output by the comparator circuit is supplied via the logic gate as the short circuit detection signal to an input of the gate driver circuit if the logic gate is enabled by the short circuit detection enable signal received from the signal delay circuit.

2. The short circuit detection apparatus according to claim 1 wherein the measurement circuit is connected to the gate-controlled power switch integrated in a package comprising a Kelvin source pin used to tap the voltage drop along the stray inductance of the gate-controlled power switch by the measurement circuit of the short circuit detection apparatus.

3. The short circuit detection apparatus according to claim 1 wherein the measurement circuit is connected to the Kelvin source pin and a source pin of the gate-controlled power switch.

4. The short circuit detection apparatus according to claim 1 wherein the gate-controlled power switch comprises a MOSFET, in particular a SiC MOSFET or a GaN MOSFET or a HEMT.

5. The short circuit detection apparatus according to claim 1 wherein the generated short circuit detection signal is supplied to an input of the gate driver circuit to trigger an automatic switch-off of the gate-controlled power switch by said gate driver circuit within a switch-off period.

6. The short circuit detection circuit according to claim 5 wherein an output voltage of a gate control signal output by the gate driver circuit and applied via a gate resistor to a gate terminal of the gate-controlled power switch is measured by means of the voltage divider circuit of the enabling short circuit detection circuit forming part of said short circuit detection signal generation circuit to provide the measured output voltage of the gate driver circuit.

7. The short circuit detection circuit according to claim 1 wherein the gate control signal applied by the gate driver circuit to the gate terminal of the gate-controlled power switch comprises a modulation signal received from a microcontroller.

8. The short circuit detection circuit according to claim 1 wherein the reference voltage comprises an internal reference voltage derived from a steady-state voltage of the measurement signal generated by the measurement circuit.

9. A fast short circuit detection method for detection of a short circuit at a gate-controlled power switch, said method comprising the steps of:
   (a) providing a measurement signal in response to a voltage drop along a stray inductance of the gate-controlled power switch; and
   (b) generating a short circuit detection signal if the provided measurement signal exceeds a reference voltage and the gate-controlled power switch is in a switched-on state,
   wherein the measurement signal generated by a measurement circuit is compared by a comparator circuit with the reference voltage to generate a comparator output signal,
   wherein the generated short circuit detection signal is supplied to an input of a gate driver circuit to trigger an automatic switch-off of the gate-controlled power switch by said gate driver circuit within a switch-off period,
   wherein an output voltage of a gate control signal output by the gate driver circuit and applied via a gate resistor to a gate terminal of the gate-controlled power switch is measured by means of a voltage divider circuit to provide a measured output voltage of the gate driver circuit,
   wherein the measured output voltage of the gate driver circuit is delayed with a delay time by a signal delay circuit to provide a short circuit detection enable signal, and
   wherein the comparator output signal is supplied via a logic gate as the short circuit detection signal to the input of the gate driver circuit if the logic gate is enabled by the short circuit detection enable signal received from the signal delay circuit.

10. The method according to claim 9 wherein the stray inductance comprises a stray inductance between a source terminal and a Kelvin Source terminal of the gate-controlled power switch.

11. The method according to claim 9 wherein the gate control signal applied by the gate driver circuit to the gate terminal of the gate-controlled power switch comprises a modulation signal received from a microcontroller.

12. The method according to claim 9 wherein the reference voltage comprises an internal reference voltage derived from a steady-state voltage of the measurement signal.

* * * * *